US012735630B2

(12) United States Patent
Diez et al.

(10) Patent No.: US 12,735,630 B2
(45) Date of Patent: Sep. 15, 2026

(54) RADIATION-EMITTING ORGANIC-ELECTRONIC DEVICE AND METHOD FOR PRODUCING A RADIATION-EMITTING ORGANIC-ELECTRONIC DEVICE

(71) Applicant: PICTIVA DISPLAYS INTERNATIONAL LIMITED, Dublin (IE)

(72) Inventors: Carola Diez, Regensburg (DE); Andreas Rausch, Regensburg (DE); Erwin Lang, Regensburg (DE)

(73) Assignee: Pictiva Displays International Limited, Dublin (IE)

( * ) Notice: Subject to any disclaimer, the term of this patent is extended or adjusted under 35 U.S.C. 154(b) by 1374 days.

(21) Appl. No.: 16/805,511

(22) Filed: Feb. 28, 2020

(65) Prior Publication Data

US 2020/0203609 A1 Jun. 25, 2020

Related U.S. Application Data

(62) Division of application No. 14/770,133, filed as application No. PCT/EP2014/056078 on Mar. 26, 2014, now Pat. No. 10,615,346.

(30) Foreign Application Priority Data

Mar. 27, 2013 (DE) ........................ 102013103156.0

(51) Int. Cl.
*H01L 51/00* (2006.01)
*C09K 11/02* (2006.01)
(Continued)

(52) U.S. Cl.
CPC ............ *C09K 11/025* (2013.01); *C09K 11/06* (2013.01); *H10K 50/11* (2023.02); *H10K 50/868* (2023.02);
(Continued)

(58) Field of Classification Search
None
See application file for complete search history.

(56) References Cited

U.S. PATENT DOCUMENTS

| | | | |
|---|---|---|---|
| 7,592,414 | B2 | 9/2009 | Meerholz et al. |
| 2003/0180574 | A1 | 9/2003 | Huang et al. |

(Continued)

FOREIGN PATENT DOCUMENTS

| | | | |
|---|---|---|---|
| DE | 10037391 | A1 | 2/2002 |
| DE | 102009010714 | A1 | 9/2010 |

(Continued)

OTHER PUBLICATIONS

Machine English translation of Oota et al. (JP-5-148192). Oct. 28, 2022.*

(Continued)

*Primary Examiner* — Jay Yang
(74) *Attorney, Agent, or Firm* — Botos Churchill IP Law LLP

(57) ABSTRACT

A method for producing a radiation-emitting device is disclosed. In an embodiment a method includes providing a substrate, applying a first electrode over the substrate, applying a fluorescent compound over the first electrode, wherein the fluorescent compound forms at least a part of a light-emitting layer of a radiation-emitting organic electronic device, and applying a second electrode over the light-emitting layer.

14 Claims, 2 Drawing Sheets

(51) Int. Cl.

| | |
|---|---|
| ***C09K 11/06*** | (2006.01) |
| ***H01L 51/50*** | (2006.01) |
| ***H01L 51/52*** | (2006.01) |
| ***H10K 50/11*** | (2023.01) |
| ***H10K 50/80*** | (2023.01) |
| ***H10K 71/00*** | (2023.01) |
| ***H10K 71/10*** | (2023.01) |
| ***H10K 85/60*** | (2023.01) |

(52) U.S. Cl.
CPC .......... *H10K 71/00* (2023.02); *H10K 71/191* (2023.02); *H10K 85/60* (2023.02); *H10K 85/6572* (2023.02); *C09K 2211/1007* (2013.01)

(56) References Cited

U.S. PATENT DOCUMENTS

| | | | | |
|---|---|---|---|---|
| 2004/0067387 | A1* | 4/2004 | Kim | C07D 333/08 549/59 |
| 2005/0282983 | A1 | 12/2005 | Holmes et al. | |
| 2011/0030877 | A1 | 2/2011 | Aoshima | |
| 2013/0264518 | A1 | 10/2013 | Yersin | |

FOREIGN PATENT DOCUMENTS

| | | | |
|---|---|---|---|
| EP | 0424829 | A1 | 5/1991 |
| JP | 5-148192 | * | 6/1993 |
| JP | 405148192 | A | 6/1993 |
| WO | 2005056499 | A2 | 6/2005 |
| WO | 2012001002 | A2 | 1/2012 |

OTHER PUBLICATIONS

Sharbati et al. (IEEE Photonics Technology Letters (2010), 22(22), 1695-1697).*
Lee et al. (Thin Solid Films 520 (2011) 95-100).*
Song et al. (Huaxue Yanjiu (2003), 14(3), 1-4).*
"Makrofol sorgt für mehr Energieeffizienz bei OLEDs für Die Extraportion Licht (Makrofol boost energy efficient in OLEDs—More light, please)," The Bayer Scientific Magazine, Edition 22, Nov. 29, 2010, pp. 14-19.
Chiang, C., et al., "Ultrahigh Efficiency Fluorescent Single and Bi-Layer Organic Light Emitting Diodes: The Key Role of Triplet Fusion," Advanced Functional Materials, vol. 23, No. 6, Feb. 2013, 8 pages.
D'Andrade, B.W., et al., "Organic light-emitting device luminaire for illumination applications," Applied Physics Letters, vol. 88, May 11, 2006, 3 pages.
Flämmich, M., et al., "Orientation of emissive dipoles in OLEDs: Quantitative in situ analysis," Organic Electronics, vol. 11, Mar. 18, 2010, pp. 1039-1046.
Frischeisen, J., et al., "Increased light outcoupling efficiency in dye-doped small molecule organic light-emitting diodes with horizontally oriented emitters," Organic Electronics, vol. 12, Feb. 26, 2011, pp. 809-817.
Goushi, K., et al., "Organic light-emitting diodes employing efficient reverse intersystem crossing for triplet-to-singlet state conversion," Nature Photonics, vol. 6, Apr. 2012, pp. 253-258.
Jankus, V., et al., "Deep Blue Exciplex Organic Light-Emitting Diodes with Enhanced Efficiency; P-type or E-type Triplet Conversion to Singlet Excitons?" Advanced Materials, vol. 25, Issue 10, Mar. 10, 2013, pp. 1455-1459.
Koh, T., et al., "Optical Outcoupling Enhancement in Organic Light-Emitting Diodes: Highly Conductive Polymer as a Low-Index Layer on Microstructured ITO Electrodes," Advanced Materials, vol. 22, Issue 16, Apr. 22, 2010, pp. 1849-1853.
Lee, S.Y., et al., "High-efficiency organic light-emitting diodes utilizing thermally activated delayed fluorescence from riazine-based doner-acceptor hybrid molecules," Applied Physics Letters, vol. 101, No. 9, Aug. 27, 2012, 4 pages.
Sharbati, M.T., "Near-Infrared Organic Light-Emitting Diodes Based on Donor-pi-Acceptor Oligomers," IEEE Photonics Technology Letters, vol. 22, No. 22, Nov. 15, 2010, pp. 1695-1697.
Uoyama, H., et al., "Highly efficient organic light-emitting diodes from delayed fluorescence," Nature: International Weekly Journal of Science, vol. 492, Dec. 13, 2012, pp. 234-238.
Yokoyama, D., et al., "Horizontal orientation of linear-shaped organic molecules having bulky substituents in neat and doped vacuum-deposited amorphous films," Organic Electronics, vol. 10, Oct. 22, 2008, pp. 127-137.
Zhang, Q., et al., "Design of Efficient Thermally Activated Delayed Fluorescence Materials for Pure Blue Organic Light Emitting Diodes," Journal of the American Chemical Society, vol. 134, No. 36, Aug. 29, 2012, pp. 14706-14709.

* cited by examiner

RADIATION-EMITTING ORGANIC-ELECTRONIC DEVICE AND METHOD FOR PRODUCING A RADIATION-EMITTING ORGANIC-ELECTRONIC DEVICE

CROSS-REFERENCE TO RELATED APPLICATIONS

This application is a divisional of U.S. patent application Ser. No. 14/770,133, filed Aug. 25, 2015, and entitled "Radiation-Emitting Organic-Electronic Device and Method for Producing a Radiation-Emitting Organic-Electronic Device," which is a national phase filing under section 371 of PCT/EP2014/056078, filed Mar. 26, 2014, which claims the priority of German Patent Application No. 10 2013 103 156.0, filed Mar. 27, 2013, all of which are incorporated herein by reference in its entirety.

TECHNICAL FIELD

The invention relates to a radiation-emitting organic electronic device and to a process for producing a radiation-emitting organic electronic device.

BACKGROUND

The external quantum efficiency of radiation-emitting organic electronic devices is defined by the ratio of photons emitted into the environment to the electron-hole pairs (excitons) injected. The external quantum efficiency can be described by the following formula:

$$\eta_{ext} = \gamma \times \eta_{S/T} \times q_{eff} \times \eta_{out}.$$

In this formula, $\gamma$ is the charge carrier equilibrium factor, which indicates the ratio between electrons and holes injected, which together form excitons. The factor $\eta_{S/T}$ indicates the proportion of excitons which can break down radiatively and is referred to as exciton formation efficiency or as singlet/triplet ratio. In fluorescent compounds, this value is limited to a maximum of 25% because of the spin selection rule. Through the use of phosphorescent compounds, it is theoretically possible to quadruple this value. $q_{eff}$ denotes the effective internal quantum efficiency, which describes the proportion of excitons which combine radiatively. The factor $\eta_{out}$ indicates what proportion of the photons generated can leave the radiation-emitting organic electronic device and is referred to as emission efficiency. The external quantum efficiency $\eta_{ext}$ of radiation-emitting organic electronic devices, especially of organic light-emitting diodes (OLEDs) is thus determined both by the nature of the emitter used and to a large degree by optical parameters.

The optical effects which reduce the efficiency of light emission from the device include coupling losses into the substrate, excitation of waveguide modes in various layers of a radiation-emitting organic electronic device, absorption losses and losses through excitation of plasmons (electron density vibrations) at metallic electrodes. The consequence of this is that only about 20% of the photons generated are emitted to the outside, meaning that the external quantum efficiency, assuming an effective internal quantum efficiency of 100%, i.e., even when phosphorescent triplet emitters are used, is limited to about 20%. If fluorescent singlet emitters are used, the theoretically achievable external quantum efficiency also decreases together with the effective internal quantum efficiency to about 5%. About 30% of the photons generated in a light-emitting layer of a radiation-emitting organic electronic device become unavailable for emission into the environment as a result of the generation of surface plasmons at a metallic electrode.

There are known measures for increasing the external quantum efficiency, for example, by more efficiently emitting the light conducted through a substrate. For this purpose, for example, films having scattered particles or films having surface structures, for instance micro-lenses or prisms, are used on the outside of the substrate. It is also known that direct structuring of the outside of the substrate can be provided, or scattered particles can be introduced into the substrate. Some of these approaches, for example, the use of scattering films, are already being used commercially and can be scaled up in terms of the emission area especially in the case of the OLEDs executed as lighting modules. However, these approaches for light emission have the significant disadvantages that the emission efficiency is limited to about 60%-70% of the light conducted within the substrate, and that the appearance of the OLED is significantly affected since the layers or films applied result in a milky, diffusely reflective surface. Disadvantages of these processes are also that costs are sometimes high and production processes complicated. There are known measures for increasing internal light emission, for example, by disposing scattering layers between the substrate and an ITO anode, or roughening the substrate surface above one ITO anode.

SUMMARY

It has not been possible by the measures described to date to minimize the proportion of the light generated in the light-emitting layer of an OLED which becomes unavailable for emission as a result of the excitation of plasmons, and at the same time to utilize all or virtually all the excitons formed, i.e., singlet and triplet excitons, for light emission when fluorescent emitters are used.

Embodiments of the present invention specify a radiation-emitting organic electronic device in which the external quantum efficiency has been improved over the prior art. Further embodiments of the present invention specify an inexpensive and simplified process compared to the prior art for producing a radiation-emitting organic electronic device having improved external quantum efficiency.

In one embodiment, a radiation-emitting organic electronic device is specified. The radiation-emitting organic electronic device comprises a substrate, a first electrode disposed atop the substrate, a light-emitting layer disposed atop the first electrode, and a second electrode diposed atop the light-emitting layer. The light-emitting layer comprises a fluorescent compound of the following formula A:

Formula A

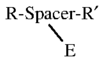

where R is an electron-withdrawing substituent and R' is an electron-donating substituent. The spacer comprises a molecular chain with the two substituents R and R' bonded to the ends and at least one E group bonded to the molecular chain. The fact that the two substituents R and R' are bonded to the ends of the molecular chain means that the molecular chain connects the substituents R and R' to one another. E comprises hydrogen and/or an organic radical. The organic radical may be an alkyl group, an amine group, a hydroxyl group, an ester group and/or an ether group. Preferably, the organic radical is an alkyl group. Preferably, the at least one E group bonded to the molecular chain is hydrogen.

Preferably, the molecular chain is a linear molecular chain. The atoms of the linear molecular chain are preferably in one plane. The at least one E group bonded to the molecular chain may project out of the plane. Preferably, the at least one E group bonded to the molecular chain is also in the plane of the molecular chain, and so all the atoms in the spacer are in one plane.

In one embodiment, the linear molecular chain is unsaturated. More particularly, the linear molecular chain has aromatic systems, heteroaromatic systems and/or CC double bonds. Preferably, the linear molecular chain consists of alternating aromatic systems, heteroaromatic systems and/or CC double bonds, with the atoms involved in the linear molecular chain in one plane. The at least one E radical bonded to the molecular chain, in this embodiment, comprises the substituents of the aromatic systems, heteroaromatic systems and/or CC double bonds. Preferably, the at least one E group bonded to the linear molecular chain is also in the plane of the linear molecular chain, such that all the atoms in the spacer are in one plane.

The fluorescent compound of the formula A is notable for its linear molecular chain. The structure of the fluorescent compound in the light-emitting layer enables alignment of the linear molecular chains of the molecule of the fluorescent compound parallel to the plane of extension of the substrate. If the atoms of the linear molecular chain are in one plane, the alignment of the linear molecular chain parallel to the plane of extension of the substrate means that the molecular plane of each linear molecular chain may be aligned parallel to perpendicularly with respect to the plane of extension of the substrate.

In the operation of the device, the molecules of the fluorescent compound each have a singlet ground state $S_0$, an excited singlet state $S_1$ populated by a singlet exciton and a triplet state $T_1$ excited by triplet excitons. The triplet state $T_1$ is composed of three sub-states. Radiation can be emitted as a result of the transition of the singlet exciton from the $S_1$ to the singlet ground state $S_0$.

As a result of the parallel alignment of the linear molecular chains of the molecules of the fluorescent compound to the plane of extension of the substrate, the transition dipole moments of the $S_1$-$S_0$ transitions of the molecules of the fluorescent compound are also aligned parallel to the plane of extension of the substrate. The orientation of the molecules of the fluorescent compound and hence also the orientation of the transition dipole moments can be determined by optical test methods, as described in D. Yokoyama et al., Organic Electronics 10, 2009, 127-137; M. Flimmich et al., Organic Electronics 11, 2010, 1039-1046; J. Frischeisen et al., Organic Electronics 12, 2011, 809-817.

In one embodiment, the lowest-energy excited states of the molecules of the fluorescent compound have different occupation in the operation of the device. The 25% singlet excitons formed according to spin statistics each occupy the lowest singlet state $S_1$ in the molecules; the triplet states formed to an extent of 75% occupy the lowest triplet state $T_1$ consisting of three sub-states, which is lower in energy than $S_1$. The radiative transition of the singlet excitons from the $S_1$ state to the singlet ground state $S_0$ can result in emission of radiation in the operation of the device. The energy separation between the states $S_1$ and $T_1$, in accordance with the invention, is so small that the $S_1$ state can efficiently be thermally repopulated from the $T_1$ state according to a Boltzmann distribution. In this way, as well as the 25% singlet excitons, it is also possible to utilize the 75% triplet excitons for light emission.

In one embodiment, the transition dipole moments of the transition of the singlet excitons from the $S_1$ state to the $S_0$ ground state of the molecules of the fluorescent compound are aligned parallel to the plane of extension of the substrate.

The alignment of the transition dipole moments parallel to the plane of extension of the substrate prevents or at least substantially reduces the loss of emitted radiation as a result of plasmon excitation.

A plasmon is understood to mean a charge carrier density vibration at the surface of a metallic electrode and an adjoining dielectric, i.e., an organic layer. The organic layer may, for example, be the light-emitting layer or a charge carrier injection layer. The radiation emitted can excite free charge carriers, especially electrons, in the metallic electrode into charge carrier density vibrations. Thus, a portion of the radiation emitted is lost as a result of the excitation and therefore can no longer be emitted from the radiation-emitting organic electronic device to the outside. More particularly, plasmons (more specifically, surface plasmon polaritons) refer here to longitudinal charge carrier density vibrations which occur parallel to the plane of extension of a surface of a metallic electrode at this surface. Surface plasmons may be generated especially at the surface of this metallic electrode facing the in the light-emitting layer. Plasmons are excited from emitted radiation which results from transitions having a dipole moment aligned at right angles to the plane of extension of the substrate. The parallel alignment or the substantially parallel alignment of the transition dipole moments of the molecules of the fluorescent compound to the plane of extension of the substrate thus allows plasmon excitation to be suppressed or substantially suppressed.

The fact that a layer or an element is disposed “atop” or has been applied “over” another layer or another element means here and hereinafter that one layer or one element is disposed directly upon the other layer or the other element in direct mechanical and/or electrical contact. In addition, it may also mean that one layer or one element is disposed indirectly upon or over the other layer or the other element. In this case, further layers and/or elements may be disposed between one layer and another and one element and another.

By virtue of the electron-withdrawing substituent R and the electron-donating substituent R', the molecules of the fluorescent compound in the ground state have a permanent dipole moment.

In one embodiment, the permanent dipole moments of the molecules of the compound of the formula A in the ground state are aligned parallel to the plane of extension of the substrate. Since the permanent dipole moments of the molecules in the ground state correlate approximately to the transition dipole moments of the $S_1$-$S_0$ transitions, it is thus possible to assure alignment of the transition dipole moments parallel to the plane of extension of the substrate.

In one embodiment, the linear molecular chains of the molecules of the fluorescent compound in the light-emitting layer are aligned parallel to one another.

In one embodiment, the light-emitting layer is obtainable by evaporation of the fluorescent compound under reduced pressure and deposition over the first electrode. The linear molecular chains of the molecules of the fluorescent compound and hence the transition dipole moments of the $S_1$-$S_0$ transitions are deposited parallel to the plane of extension of the substrate.

In one embodiment, the light-emitting layer is obtainable by application of the fluorescent compound in solution over the first electrode, for example, by spin-coating, spraying methods or printing methods. The linear molecular chains of the molecules of the fluorescent compound and hence the transition dipole moments of the $S_1$-$S_0$ transitions are deposited parallel to the plane of extension of the substrate.

Considering the components of the transition dipole moments of the molecules of the fluorescent compound parallel ($\mu_\|$) and at right angles ($\mu_\perp$) to the plane of extension of the substrate, the $\mu_\|/\mu_\perp$ ratio of the magnitudes of these two components, in one embodiment, is more than 2:1, preferably more than 5:1, more preferably more than 10:1 and most preferably more than 20:1.

In one embodiment, the light-emitting layer consists of the fluorescent compound.

The light-emitting layer may also comprise or consist of two or more fluorescent compounds of the formula A.

In one embodiment, the transition of the singlet excitons from the $S_1$ state to the $S_0$ state in the operation of the device may result in emission in the visible region of the electromagnetic spectrum, for example, in the blue, green or red spectral region.

In one embodiment, the radiation-emitting organic electronic device comprises at least one further light-emitting layer. For example, the radiation-emitting organic electronic device comprises a first light-emitting layer which emits radiation in the blue wavelength range, a second light-emitting layer which emits radiation in the green wavelength range, and a third light-emitting layer which emits radiation in the red wavelength range. The radiation emitted to the outside may give a white light impression. All features which have been described for the light-emitting layer also apply to the further light-emitting layers.

Since the molecules of the fluorescent compound have only one radiative transition and hence only one transition dipole moment, the molecular plane of the linear molecular chain of the molecules of the fluorescent compound may be arranged in any desired orientation, i.e., parallel to right angles to the plane of extension of the substrate. In other words, the molecular plane of the linear molecular chain may assume any orientation which is rotationally symmetric with respect to the axis of the transition dipole moment. This is shown visually in FIG. 2.

In one embodiment, R is selected from a group of electron-withdrawing substituents comprising

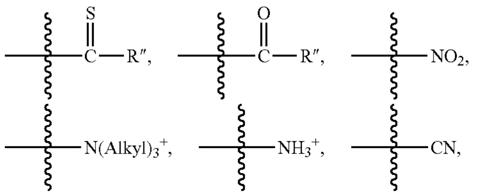

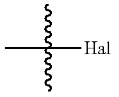 and 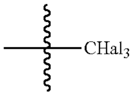

where  represents the bond of the substituent R to the spacer, where R"=H, alkyl, OH, Oalkyl, SH, Salkyl or Hal, alkyl=$CH_3$, $C_2H_5$, $CH(CH_3)_2$ or $CH_2CH_2CH_3$ and Hal=F, Cl, Br or I. Preferably, R"=alkyl, OH, Oalkyl or Hal, alkyl=$CH_3$ or $C_2H_5$ and Hal=F or Cl.

In one embodiment, R' is selected from a group of electron-donating substituents comprising

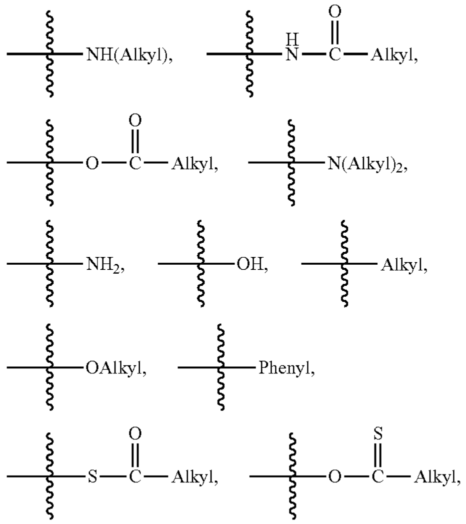

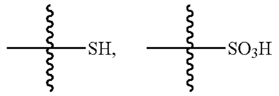 and 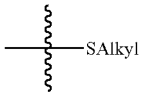

where  represents the bond of the substituent R' to the spacer, where alkyl=$CH_3$, $C_2H_5$, $CH(CH_3)_2$ or $CH_2CH_2CH_3$, preferably alkyl=$CH_3$ or $C_2H_5$.

In one embodiment, the fluorescent compound is selected from a group of compounds of the general formulae 1 to 13

Formula 1

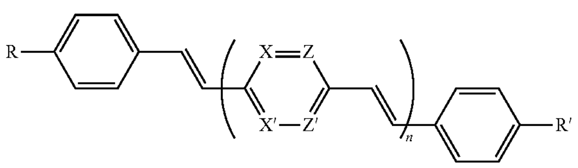

Formula 2

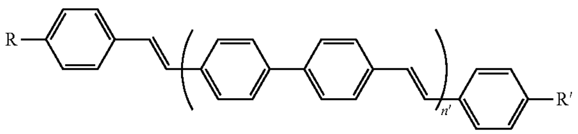

Formula 3

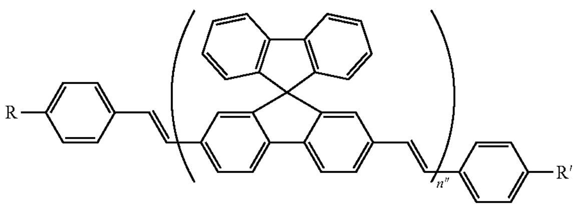

-continued

Formula 4

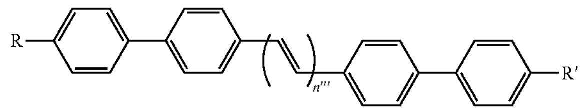

Formula 5

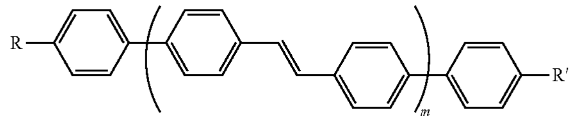

Formula 6

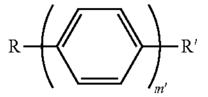

Formula 7

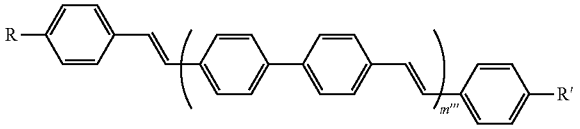

Formula 8

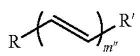

Formula 9

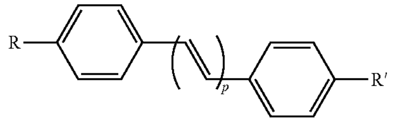

Formula 10

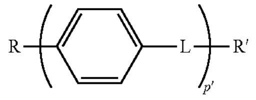

Formula 11

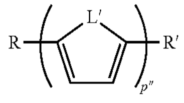

Formula 12

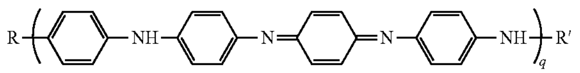

Formula 13

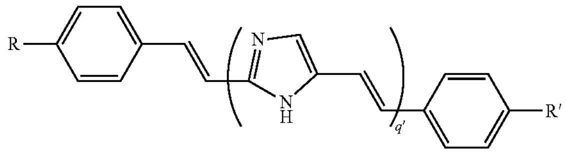

R in the formulae 1 to 13 is an electron-withdrawing substituent and R' is an electron-donating substituent. X, X', Z and Z' are the same or different and are each independently C—H or N. L and L' are each NH, O or S. In addition:

n, n', n'', n''', m, m''', q=1, 2, 3 or 4, preferably n, n', n'', m, m''', q=1 or 2 and n'''=2 or 3;

m', m'', p''=4, 5, 6, 7, 8 or 9, preferably m', m''=5 or 6;

p, p', q'=3, 4, 5, 6 or 7, preferably p, p', q'=5 or 6.

In one embodiment, the hydrogen atoms on the CC double bonds and on the aromatic systems of the compounds of the formulae 1 to 13 may be replaced wholly or partly by an organic radical. The organic radical may be an alkyl group, an amine group, a hydroxyl group, an ester group or an ether group. Preferably, the organic radical is an alkyl group. The alkyl group is preferably a methyl or ethyl group. The hydrogen atoms and/or the organic radical thus correspond to the at least one E group bonded to the molecular chain in the fluorescent compound of the formula A. For example, a compound of the following structure derived from formula 5 is thus possible:

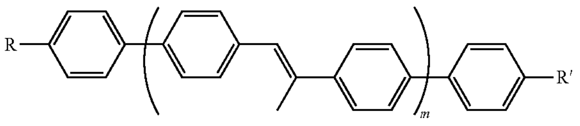

In one embodiment, the aromatic systems in the compounds of the formulae 1 to 13 may be wholly or partly replaced by five- or six-membered heteroaromatic systems. For example, a compound of the following structure derived from formula 9 is thus possible:

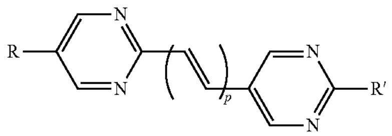

The five-membered heteroaromatic systems may be selected, for example, from a group comprising pyrrole, furan, thiophene, selenophene, imidazole, oxazole and thiazole.

The six-membered heteroaromatic systems may be selected, for example, from a group comprising pyridine, phosphabenzene, pyridazine, pyrimidine, pyrazine, 1,2,4-triazine and 1,2,4,5-tetrazine.

In one embodiment, R is selected from a group of electron-withdrawing substituents comprising

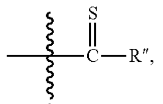 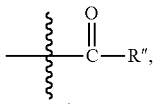 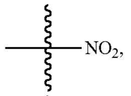

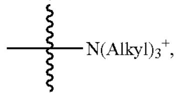 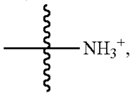 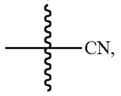

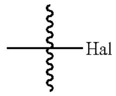 and 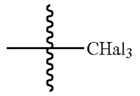

where  represents the bond of the substituent R to the compounds of the general formulae 1 to 13, where R''=H, alkyl, OH, Oalkyl, SH, Salkyl or Hal, alkyl=$CH_3$, $C_2H_5$, $CH(CH_3)_2$ or $CH_2CH_2CH_3$ and Hal=F, Cl, Br or I. Preferably, R''=alkyl, OH, Oalkyl or Hal, alkyl=$CH_3$ or $C_2H_5$ and Hal=F or Cl.

In one embodiment, R' is selected from a group of electron-donating substituents comprising

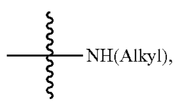 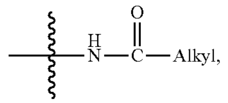

-continued

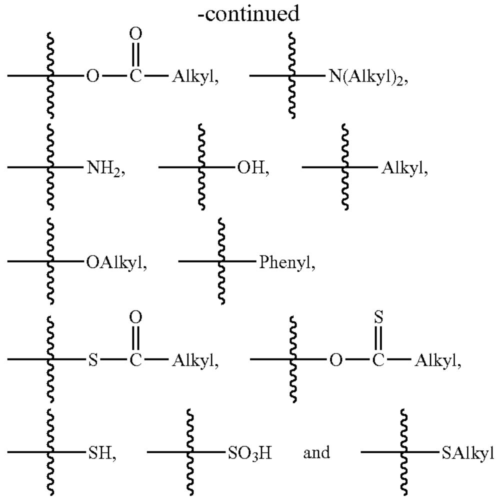

and where  represents the bond of the substituent R' to the compounds of the general formulae 1 to 13, where alkyl=$CH_3$, $C_2H_5$, $CH(CH_3)_2$ or $CH_2CH_2CH_3$, preferably alkyl=$CH_3$ or $C_2H_5$.

In one embodiment, the substituents on the CC double bonds of the compounds of the formulae 1 to 5, 7 to 9 and 13 are arranged trans to one another. In one embodiment, the substituents are hydrogen atoms. The substituents may also be an organic radical. In this embodiment, the compounds of the formulae 1 to 5, 7 to 9 and 13 are the all-trans compounds. The electron-withdrawing substituent R and the electron-donating substituent R' in the compounds are joined to one another via a linear molecular chain. The molecular chain may extend in one plane. All the atoms of the linear molecular chain are preferably in one plane.

The fluorescent compounds of the formulae 1 to 13 are notable for their elongated and linear molecular chain. The elongated linear molecular chain connects the substituents R and R' to one another. The linear molecular chain extends in one plane. The compounds of the formulae 1 to 13 can produce a light-emitting layer in which the molecular planes of the linear molecular chains of the molecules of the fluorescent compounds of the formulae 1 to 13 are arranged anisotropically with respect to the plane of extension of the substrate. The anisotropic alignment of the molecular plane of the linear molecular chain of the molecules of the fluorescent compound with respect to the plane of extension of the substrate results in alignment of the transition dipole moments of the $S_1$-$S_0$ transitions of the molecules of the fluorescent compound parallel to the plane of extension of the substrate.

In one embodiment of the device, the light-emitting layer comprises a matrix material with the fluorescent compound present therein.

In one embodiment, the matrix material has an isotropic molecular structure. For example, the matrix material may be MCP (1,3-bis(carbazol-9-yl)benzene), TCP (1,3,5-tris (carbazol-9-yl)benzene), TcTa (4,4',4"'-tris-(carbazol-9-yl) triphenylamine), CBP (4,4'-bis(carbazol-9-yl)biphenyl), UGH-2 (1,4-bis(triphenylsilyl)benzene), UGH-3 (1,3-bis (triphenylsilyl)benzene), spiro-CBP (2,2',7,7'-tetrakis(carbazol-9-yl)-9,9-spirobifluorene), DPFL-CBP (2,7-bis(carbazol-9-yl)-9,9-ditolylfluorene), BST (4,4'-di(triphenylsilyl)-p-terphenyl) or BSB (4,4'-di(triphenylsilyl)biphenyl). The matrix material may also be one of the following compounds:

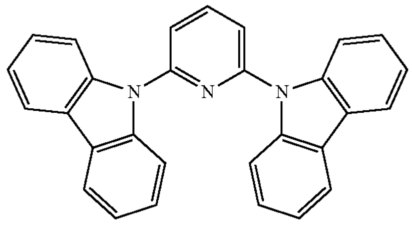

PYD2 ,

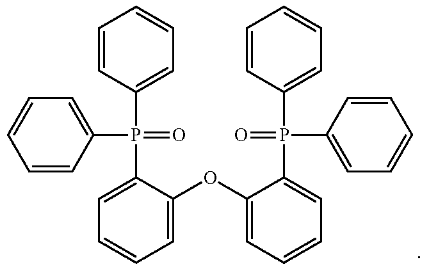

DPEPO .

It is also possible to use conventional matrix materials known to those skilled in the art.

In one embodiment, the matrix material has an anisotropic molecular structure. By means of matrix materials of this kind, it is possible to additionally support anisotropic or parallel alignment of the molecules of the fluorescent compound relative to the plane of extension of the substrate. For the matrix material having anisotropic molecular structure, this means, more particularly, that there must not be any essentially symmetrically substituted bonding points within the molecular structure.

More particularly, a matrix material having anisotropic molecular structure is understood to mean a material in which there are no instances of three, four or more substituents having identical or essentially identical structure proceeding from a central branching point, especially a central atom or a central ring, taking account only of non-hydrogen substituents. An identical structure means here that the substituents are identical. An essentially identical structure, moreover, means that the at least three substituents differ in terms of the molecular weight that they account for, but none of the substituents at the branching point has a molecular weight at least 50% below any of the other substituents, observing only non-hydrogen substituents. Accordingly, molecules having anisotropic molecular structure are not highly symmetric molecules having more than two identical substituents, or have different substituents in the case of branching points having three or more substituents, for example, in the case of branching points such as tertiary amine nitrogen atoms or at least trisubstituted benzene rings. In a further embodiment, the matrix material may have hole-conducting and/or electron-conducting properties.

In the fluorescent compounds of the formula A, especially of the formulae 1 to 13, the electron-withdrawing substituents R and the electron-donating substituents R' are spatially separated from one another by the linear molecular chain. As a result, the HOMO (highest occupied molecular orbital) localized on the electron-donating substituent and the LUMO (lowest unoccupied molecular orbital) localized on the electron-withdrawing substituent in these molecules are spatially separated and have only a very minor overlap. The electronically excited singlet and triplet states $S_1$ and $T_1$ are generated by the transition of an electron from the HOMO to the LUMO. The so-called non-classical exchange interaction between the two unpaired electrons in HOMO and LUMO leads to an energetic splitting between the actually degenerate, i.e., energetically equal, states $S_1$ and $T_1$; $T_1$ is lowered in energy. The strength of the exchange interaction and hence the size of the $S_1$-$T_1$ splitting correlates with the HOMO-LUMO overlap, which, in accordance with the invention, is weak because of the molecular structure of the compounds of the formula A, especially the compounds of the formulae 1 to 13. This results in a very low energy separation between $T_1$ and $S_1$; the latter can thus efficiently be thermally repopulated from $T_1$ at room temperature in accordance with the Boltzmann distribution. As a result of the repopulation, it is also possible for the triplet excitons formed to an extent of 75% to be utilized for emission of radiation from the fluorescent compounds. In the case of the light-emitting layers comprising the fluorescent compounds of the invention, it is thus possible to achieve effective internal quantum efficiency as in the case of phosphorescent emitters through the utilization of all or virtually all excitons. The use of costly phosphorescent emitters, for example, platinum or iridium complexes, can thus be avoided.

In one embodiment, in the operation of the device, more than 25% of the singlet and triplet excitons formed are utilized for emission of radiation. In one embodiment, between 25% and 99%, preferably between 50% and 99%, more preferably between 85% and 99%, of the singlet and triplet excitons formed are utilized for emission of radiation. This leads to an elevated effective internal quantum efficiency of the radiation-emitting organic electronic device compared to conventional devices having fluorescent emitters, in which only 25% of all the excitons formed, namely only the singlet excitons formed, can be utilized for emission of radiation.

Overall, the external quantum efficiency of the radiation-emitting organic electronic device is increased. This is achieved in accordance with the invention firstly by suppressing or substantially suppressing plasmon excitation and, in addition, by the ability to utilize more than 25% of the excitons generated for emission of radiation, meaning that the effective internal quantum efficiency is increased.

In one embodiment, the external quantum efficiency of the radiation-emitting organic electronic device is more than 20%, preferably more than 35%, more preferably up to 50%. No internal or external emission structures are needed to achieve these values.

In one embodiment, the radiation-emitting organic electronic device comprises internal and/or external emission structures. In this way, the external quantum efficiency can be increased once again and an external quantum efficiency of up to 99% can be achieved. For example, films comprising scattering particles or films having surface structures such as micro-lenses or prisms may be applied on the outside of the substrate. Direct structuring of the outside of the substrate is also possible, or scattering particles are introduced into the substrate. It is also possible for scattering layers to be arranged between the substrate and the first electrode or for the substrate surface above which the first electrode is disposed to be roughened.

In one embodiment, the energy difference between the $S_1$ state and the $T_1$ state is between 0.01 eV and 0.25 eV. Preferably, the energy difference between the $S_1$ state and the $T_1$ state is between 0.01 eV and 0.18 eV, more preferably between 0.01 eV and 0.10 eV.

Interestingly, the actually spin-forbidden reverse intersystem crossing process from $T_1$ into the $S_1$ state is very efficient because of the small energy split between the states; the literature reports reverse intersystem crossing efficiencies of up to 86% for purely organic molecules having a high charge transfer component of the lowest electronic states and small $S_1$-$T_1$ splits (Gouchi et al., Nature Photonics 2012, 6, 253). Correspondingly high efficiencies can also be achieved in the inventive embodiments of the fluorescent compound, such that no additional materials having high spin-orbit coupling are needed to increase the efficiency of the $S_1$-$T_1$ transition. The light-emitting layer can thus consist exclusively of the fluorescent compound or of the fluorescent compound and the matrix material.

In one embodiment, the light-emitting layer is obtainable by co-evaporation of the fluorescent compound and the matrix material under reduced pressure and deposition of the fluorescent compound and the matrix material over the first electrode.

In one embodiment, the light-emitting layer is obtainable by application of the fluorescent compound and the matrix material in solution over the first electrode, for example, by means of spin-coating, spraying methods or printing methods.

In one embodiment, the first and/or second electrode is transparent. "Transparent" in the present context is understood to mean that the material, a layer or an element is at least partly transparent to the entire visible electromagnetic spectrum or part thereof. The first and/or second electrode may each be connected as the anode or as the cathode. Light generated in the light-emitting layer, for example, of an OLED, can thus be emitted via the anode or via the cathode.

In a further embodiment, a transparent electrode includes a transparent conductive oxide or consists of a transparent conductive oxide. Transparent conductive oxides (TCOs) are transparent conductive materials, generally metal oxides, for example, zinc oxide, tin oxide, calcium oxide, titanium oxide, indium oxide or indium tin oxide (ITO). As well as binary metal-oxygen compounds, for example, ZnO, $SnO_2$ or $In_2O_3$, the group of the TCOs also includes ternary metal-oxygen compounds, for example, AlZnO, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides, and they may be used in various working examples. Moreover, the TCOs do not necessarily correspond to a stoichiometric composition and may also be p-doped or n-doped.

In addition, the transparent electrode may be a metallic electrode. The metallic electrode includes, for example, a metal which may be selected from aluminum, barium, indium, silver, gold, magnesium, calcium, samarium, germanium, zinc, copper, indium, tin and lithium, and compounds, combinations and alloys thereof. The metallic electrode has such a low thickness that it is at least partly transparent to light. In various working examples, the transparent electrode may be formed from a layer stack of a combination of a layer of a metal on a layer of a TCO, or vice versa. One example is a silver layer applied to an indium tin oxide layer (ITO) (Ag on ITO) or ITO—Ag-ITO multilayers. It is possible here for a further grown-on metal layer containing germanium or consisting of germanium to be applied to the first ITO layer as a wetting mediator, in order to improve the homogeneous deposition, for example of Ag, as a layer of the layer stack of the transparent electrode of the layer sequence.

In various working examples, the transparent electrode may provide one or more of the following materials as an alternative to or in addition to the abovementioned materials: networks composed of metallic nanowires and -particles, for example, composed of Ag, networks composed of carbon nanotubes; graphene particles and layers and networks composed of semiconductive nanowires.

If only one of the first and second electrodes is transparent, the other electrode is preferably reflective. The reflective electrode is preferably a metallic electrode and includes, for example, a metal which may be selected from aluminum, barium, indium, silver, gold, magnesium, calcium, germanium, samarium, zinc, copper, indium, tin and lithium, and compounds, combinations and alloys thereof. Alternatively or additionally, the reflective electrode may also include one or more of the abovementioned transparent conductive oxides.

In one embodiment, the reflective electrode may comprise several layers. For example, it may be a layer stack of several layers of the same metal or different metals and/or of the same TCO or different TCOs. For example, the reflective electrode comprises at least one layer of a transparent conductive oxide and at least one metallic layer.

In one embodiment, the first and/or second electrode is a metallic electrode or electrode comprising at least one metallic layer.

If the first electrode is reflective and the second electrode transparent, the light generated in the light-emitting layer is emitted upward through the second electrode and the radiation-emitting organic electronic device takes the form of a "top emitter".

In one embodiment, the second electrode is the cathode and can thus inject electrons into the adjoining layers. The first electrode is the anode and serves to inject holes into the adjoining layers.

In one embodiment, the substrate takes the form of a layer, a sheet, a film or a laminate. The layer, sheet, film or laminate may comprise or consist of glass, quartz, plastic, metal, silicon wafer or combinations of said materials.

In one embodiment, the substrate is transparent. Thus, when the first electrode is transparent, light generated can be emitted from the light-emitting layer through the substrate. The radiation-emitting organic electronic device, for example, an OLED, can thus take the form of a "bottom emitter". It is also possible for the device to be a "transparent OLED" when the second electrode is additionally transparent and light is thus emitted both downward through a transparent first electrode and a transparent substrate and upward through a transparent second electrode.

In addition, the distance of the light-emitting layer from the first and/or second electrode may be between 0 and 500 nm, between 0 and 300 nm or between 0 and 90 nm. More particularly, the distance of the light-emitting layer from the first and/or second electrode may be between 0 and 500 nm, between 0 and 300 nm or between 0 and 90 nm when the first and/or second electrode is a metallic electrode or an electrode comprising at least one metallic layer, since plasmon excitation at the metallic electrode or at the metallic layer of an electrode is already suppressed or almost completely suppressed by the fluorescent compound in the light-emitting layer. The distance is matched to the wavelength of the radiation emitted by the fluorescent compound. The longer the wavelength of the radiation emitted, the greater the distance between the light-emitting layer and the first and/or second electrode chosen to achieve optimal optical conditions. The distance is also chosen such that it is within a cavity minimum.

Preferably, the distance of the light-emitting layer from the first and/or second electrode may be between 40 and 60 nm. More preferably, the distance of the light-emitting layer from the first and/or second electrode may be between 45 and 55 nm, for example, 50 nm.

In one embodiment, an electron or hole blocker layer is disposed between the first and/or second electrode and the light-emitting layer. Materials for electron or hole blocker layers are known to those skilled in the art. Through the use of electron and hole blocker layers, it is possible to achieve an ideal charge carrier equilibrium, which allows the external and internal quantum efficiency of a radiation-emitting organic electronic device to be enhanced.

In one embodiment, a first charge carrier injection layer is disposed between the first electrode and the light-emitting layer and/or a second charge carrier injection layer is disposed between the light-emitting layer and the second electrode.

In one embodiment, the first charge carrier injection layer is in direct contact with the first electrode and the light-emitting layer and/or the second charge carrier injection layer is in direct contact with the light-emitting layer and the second electrode.

In one embodiment, the first charge carrier injection layer and/or the second charge carrier injection layer has a layer thickness between 40 nm and 900 nm, preferably between 45 nm and 55 nm, more preferably 50 nm. Since, in accordance with the invention, no losses or almost no losses occur as a result of plasmon excitation, this low layer thickness of the first and/or second charge carrier injection layer is sufficient, since plasmon excitation is not necessarily prevented or attenuated by the thickness of the first and/or second charge carrier layer. In one embodiment, the first charge carrier injection layer or the second charge carrier injection layer is a hole injection layer.

Advantageous materials, especially for a hole injection layer, have been found to be, for example, tertiary amines, carbazole derivatives, conductive polyaniline or polyethylenedioxythiophene. In addition, for example, the following materials may be suitable: NPB (N,N'-bis(naphth-1-yl)-N,N'-bis(phenyl)benzidine, β-NPB (N,N'-bis(naphth-2-yl)-N,N'-bis(phenyl)benzidine), TPD (N,N'-bis(3-methylphenyl)-N,N'-bis(phenyl)benzidine), N,N'-bis(naphth-1-yl)-N,N'-bis(phenyl)-2,2-dimethyl-benzidine, DMFL-TPD (N,N'-bis(3-methylphenyl)-N,N'-bis(phenyl)-9,9-dimethylfluorene, DMFL-NPB (N,N'-bis(naphth-1-yl)-N,N'-bis(phenyl)-9,9-dimethyl-fluorene), DPFL-TPD (N,N'-Bis(3-methylphenyl)-N,N'-bis(phenyl)-9,9-diphenylflnoren), DPFL-NPB (N,N'-bis(naphth-1-yl)-N,N'-bis(phenyl)-9,9-diphenyl-fluorene), TAPC (di-[4-(N,N-ditolylamino)-phenyl]cyclohexane), PAPB (N,N'-bis(phenanthren-9-yl)-N,N'-bis(phenyl)benzidine), TNB (N,N,N',N'-tetranaphth-2-ylbenzidine), TiOPC (titanium oxide phthalocyanine), CuPC (copper phthalocyanine), PPDN (pyrazino[2,3-f]-[1,10]phenanthroline-2,3-dicarbonitrile), MeO-TPD (N,N,N',N'-tetrakis(4-methoxyphenyl)benzidine), β-NPP (N,N'-di(naphth-2-yl)-N,N'-diphenylbenzene-1,4-diamine), NTNPB (N,N'-diphenyl-N,N'-di[4-(N,N-ditolyl-amino)phenyl]benzidine) and NPNPB (N,N'-diphenyl-N,N'-di-[4-(N,N-diphenylamino)phenyl]benzidine), 1,4-bis(2-phenylpyrimidin-5-yl)benzene (BPPyP), 1,4-bis(2-methylpyrimidin-5-yl)benzene (BMPyP), 1,4-di(1,10-phenanthrolin-3-yl)benzene (BBCP), 2,5-di(pyridin-4-yl)pyrimidine (DPyPy), 1,4-bis(2-(pyridin-4-yl)pyrimidin-5-yl)benzene (BPyPyP), 2,2',6,6'-tetraphenyl-4,4'-bipyridine (GBPy), 1,4-di(benzo[h]-quinolin-3-yl)benzene (PBAPA), 2,3,5,6-tetraphenyl-4,4'-bipyridine (TPPyPy), 1,4-bis(2,3,5,6-tetraphenyl-pyridin-4-yl)benzene (BTPPyP), 1,4-bis(2,6-tetrapyridinylpyridin-4-yl)benzene (BDPyPyP) or mixtures of the aforementioned substances.

Dopants used may, for example, be a metal oxide, an organometallic compound, an organic material or a mixture thereof, for example, $WO_3$, $MOO_3$, $V_2O_5$, $Re_2O_7$ and $Re_2O_5$, dirhodium tetrafluoroacetate ($Rh_2(TFA)_4$) or the isoelectronic ruthenium compound $Ru_2(TFA)_2(CO)_2$ or an organic material having aromatic functional groups or an aromatic organic material, for example, aromatic materials having a significant number or fluorine and/or cyanide (CN) substituents. For example, the organic material may be F4-TCNQ (2,3,5,6-tetrafluoro-7,7,8,8-tetracyanoquino-dimethane) or F6-TCNQ.

In one embodiment, the first charge carrier injection layer or the second charge carrier injection layer is an electron injection layer.

In a further embodiment, an electron injection layer conductive layer includes at least one electron injection layer, an electron transport layer or a combination thereof. Suitable materials for the electron-conductive layer may include, for example, the following materials: PBD (2-(4-biphenylyl)-5-(4-tert-butylphenyl)-1,3,4-oxadiazole), BCP (2,9-dimethyl-4,7-diphenyl-1,10-phenanthroline), BPhen (4,7-diphenyl-1,10-phenanthroline), TAZ (3-(4-biphenylyl)-4-phenyl-5-tert-butylphenyl-1,2,4-triazole), bpy-OXD (1,3-bis[2-(2,2'-bipyrid-6-yl)-1,3,4-oxadiazol-5-yl]benzene), BP-OXD-Bpy (6,6'-bis[5-(biphenyl-4-yl)-1,3,4-oxadiazol-2-yl]-2,2'-bipyridyl), PADN (2-phenyl-9,10-di(naphth-2-yl) anthracene), Bpy-FOXD (2,7-Bis[2-(2,2'-bipyrid-6-yl)-1,3,4-oxadiazol-5-yl]-9,9-dimethylfluorene), OXD-7 (1,3-bis[2-(4-tert-butylphenyl)-1,3,4-oxadiazol-5-yl]-benzene), HNBphen (2-(naphth-2-yl)-4,7-diphenyl-1,10-phenanthroline), NBphen (2,9-bis(naphth-2-yl)-4,7-diphenyl-1,10-phenanthroline), and 2-NPIP (1-methyl-2-(4-(naphth-2-yl) phenyl)-1H-imidazo[4,5-f][1,10]-phenanthroline) and mixtures of the aforementioned substances.

A dopant used may, for example, be an alkali metal, an alkaline earth metal, an alkali metal salt, an alkaline earth metal salt, an organometallic compound, an organic compound, for example, aromatic compounds, a molecular dopant or a mixture thereof, for example, Li, $Cs_3PO_4$, $Cs_2CO_3$, a metallocene, i.e., an organometallic compound having a metal M and two cyclopentadienyl radicals (Cp) in the $M(Cp)_2$ form, or a metal hydropyrimidopyridine complex. The metal may, for example, comprise or be tungsten, molybdenum and/or chromium.

In one embodiment, the radiation-emitting organic electronic device is an organic light-emitting diode (OLED).

The specified embodiments of the radiation-emitting organic electronic device may be produced by the process specified hereinafter.

The process for producing a radiation-emitting organic electronic device comprises the process steps of:

A) providing a substrate,

B) applying a first electrode to the substrate,

C) applying a fluorescent compound of the following formula A to the first electrode for production of a light-emitting layer Formula A

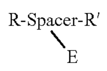

where R is an electron-withdrawing substituent and R' is an electron-donating substituent. The spacer comprises a linear molecular chain with the two substituents R and R' bonded to the ends. The spacer further comprises at least one E group bonded to the linear molecular chain. E comprises hydrogen and/or an organic radical. The organic radical may be an alkyl group, an amine group, a hydroxyl group, an ester group and/or an ether group. The organic radical is preferably an alkyl group, D) applying a second electrode to the light-emitting layer.

In the operation of the device produced by the process, the molecules of the fluorescent compound each have a singlet ground state $S_0$, an excited singlet state $S_1$ populated by a singlet exciton and a triplet state $T_1$ excited by triplet excitons. The triplet state $T_1$ is composed of three sub-states. Radiation can be emitted as a result of the transition of the singlet exciton from the $S_1$ to the singlet ground state $S_0$.

In one embodiment, the fluorescent compound is applied in process step C) in such a way that the transition dipole moment of the transition of the singlet exciton from the $S_1$ state to the $S_0$ ground state in the molecules of the fluorescent compound is aligned parallel to the plane of extension of the substrate.

In one embodiment, the fluorescent compound is applied in process step C) in such a way that the linear molecular chains of the molecules are aligned parallel to the plane of extension of the substrate.

By virtue of the electron-withdrawing substituent R and the electron-donating substituent R', the molecules of the fluorescent compound of the formula A have a permanent dipole moment in the ground state.

In one embodiment, the fluorescent compound is applied in process step C) in such a way that the permanent dipole moments of the molecules of the fluorescent compound of the formula A in the ground state are aligned parallel to the plane of extension of the substrate. Since the permanent dipole moments of the molecules in the ground state correlate approximately to the transition dipole moments of the $S_1$-$S_0$ transitions, alignment of the transition dipole moments parallel to the plane of extension of the substrate can thus be assured.

In one embodiment, the fluorescent compound, in process step C), is evaporated under reduced pressure and deposited on the first electrode or dissolved in a solvent and applied to the first electrode. For example, the fluorescent compound is applied in solution over the first electrode by spin-coating, spraying methods or printing methods.

In one embodiment, the solvent is selected from a group of solvents comprising ethanol, isopropanol, acetonitrile, dichloromethane, phenetole, xylene, anisole, mesitylene, toluene, chlorobenzene and tetrahydrofuran. However, there are also other suitable solvents in which the fluorescent compound can be dissolved.

In one embodiment, process step C) comprises:

applying a fluorescent compound of the formula A and a matrix material for production of a light-emitting layer, wherein the linear molecular chains of the molecules of the fluorescent compound of the formula A are aligned parallel to the plane of extension of the substrate.

In one embodiment, the alignment of the transition dipole moments of the transition of the singlet excitons from the $S_1$ to the $S_0$ parallel to the plane of extension of the substrate in process step C) is promoted by an applied electrical or magnetic field. The electrical or magnetic field has preferably been applied in such a way that the permanent dipole moments of the molecules of the compounds of the formula A in the ground state are arranged parallel to the plane of extension of the substrate. Since the permanent dipole moments of the molecules in the ground state correlate approximately to the transition dipole moments of the $S_1$-$S_0$ transitions, alignment of the transition dipole moments parallel to the plane of extension of the substrate can thus be assured.

In one embodiment, process step C) for producing a light-emitting layer comprises the following process steps:

- providing a source of a fluorescent compound of the following formula A or for a fluorescent compound of the following formula A and a matrix material Formula A

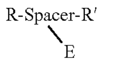

where R is an electron-withdrawing substituent and R' is an electron-donating substituent. The spacer comprises a linear molecular chain with the two substituents R and R' bonded to the ends. The spacer further comprises at least one E group bonded to the linear molecular chain. E comprises hydrogen and/or an organic radical. The fluorescent compound or the fluorescent compound and the matrix material are released from the source at least partly in the gaseous state,

- applying an electrical field between the substrate and the source, and
- applying the fluorescent compound or the fluorescent compound and the matrix material to the first electrode while the electrical field is being applied.

The applied electrical field makes it possible for the fluorescent compound to be deposited in such a way that the linear molecular chains of the molecules of the fluorescent compound are aligned parallel to the plane of extension of the substrate.

In one embodiment, the electrical field has a field strength between 0.1 kV/mm and 10 kV/mm inclusive.

The source is set up to release the fluorescent compound or the fluorescent compound and the matrix material partly or fully in the gaseous or vaporous state. For example, the source is formed by a heatable crucible in which the fluorescent compound to be applied or the fluorescent compound to be applied and the matrix material to be applied are present.

BRIEF DESCRIPTION OF THE DRAWINGS

Further advantageous embodiments and developments of the invention are apparent from the working examples described hereinafter and in conjunction with the figures.

Figure 1:
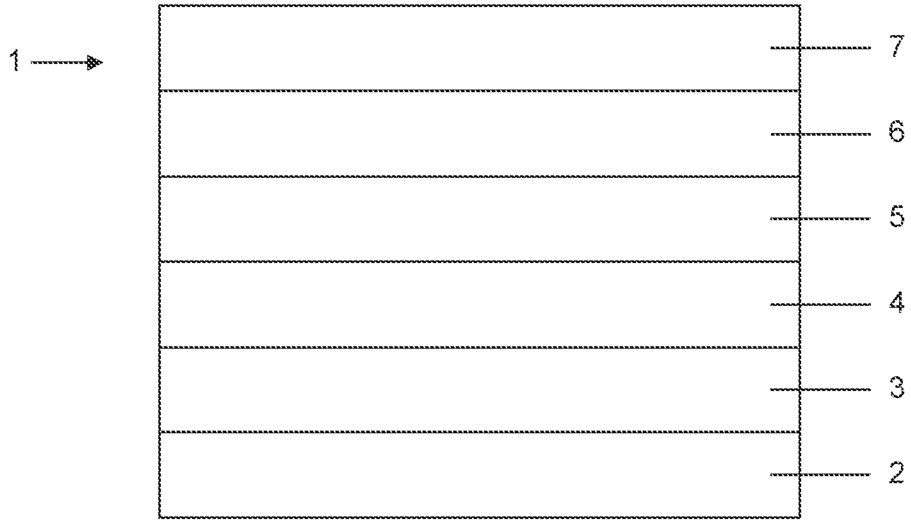
FIG. 1 shows a schematic side view of one embodiment of a radiation-emitting organic electronic device.

In the working examples and figures, identical or equivalent constituents are each given the same reference numerals. The elements shown and the size ratios thereof relative to one another should not be regarded as being to scale. Instead, individual elements, especially layer thicknesses, may be shown in a disproportionately large size for better understanding.

DETAILED DESCRIPTION OF ILLUSTRATIVE EMBODIMENTS

FIG. 1 shows an embodiment of a radiation-emitting organic electronic device (1). Disposed atop a substrate (2), for example, a glass substrate, is a first electrode (3). The first electrode (3) is connected as the anode, consists of ITO and is transparent. Disposed atop the first electrode (3) is a first charge carrier injection layer (4). The first charge carrier injection layer (4) takes the form of a hole injection layer and consists, for example, of NPB. The light-emitting layer (5) is disposed between the first (4) and a second charge carrier injection layer (6). The light-emitting layer (5) comprises a matrix material, for example, TCP (1,3,5-tris(carbazol-9-yl)-benzene), with a fluorescent compound present therein. The fluorescent compound is, for example,

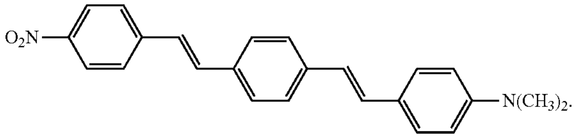 [SMILES: CN(C)c1ccc(/C=C/c2ccc(/C=C/c3ccc([N+](=O)[O-])cc3)cc2)cc1]

The transition dipole moments of the transitions of the singlet excitons from the $S_1$ to the $S_0$ state of the molecules of the fluorescent compound are aligned parallel to the plane of extension of the substrate (2). The energy separation between the states $S_1$ and $T_1$ of the molecules of the fluorescent compound is between 0.01 eV and 0.25 eV and is thus sufficiently small that the $S_1$ state can efficiently be thermally repopulated from the $T_1$ state in accordance with a Boltzmann distribution, as a result of which, as well as the 25% singlet excitons, the 75% triplet excitons can also be utilized for light emission. The second charge carrier injection layer (6) is an electron injection layer, consists, for example, of BCP and has a layer thickness 500 nm. Disposed atop the second charge carrier injection layer (6) is the second electrode (7). The second electrode (7) is connected as the cathode, consists of silver and is reflective. The alignment of the transition dipole moments of the transitions of the singlet excitons from the $S_1$ state to the $S_0$ state parallel to the plane of extension of the substrate (2) prevents or at least substantially prevents the loss of the radiation emitted as a result of plasmon excitation of silver cathode. The radiation-emitting organic electronic device (1), in operation, emits light to the outside in the downward direction through the first electrode (3) and the substrate (2) and thus takes the form of a "bottom emitter". Overall, an external quantum efficiency of the radiation-emitting organic electronic device exceeding 20% can be achieved, since, firstly, plasmon excitation is suppressed or substantially suppressed and, in addition, more than 25% of the excitons generated can be utilized for emission of radiation.

Figure 2:
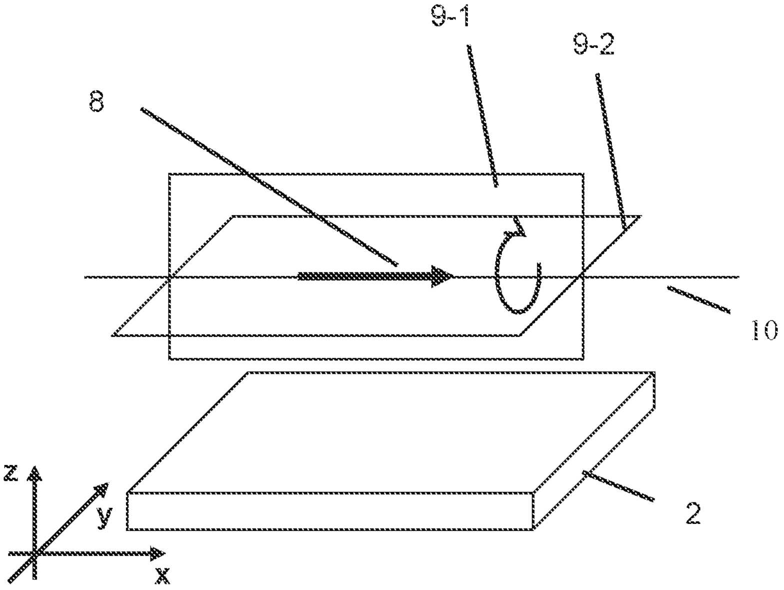
FIG. 2 shows the alignment of transition dipole moments of the molecules of the fluorescent compound of the invention parallel to the plane of extension of a substrate in a radiation-emitting organic electronic device.

FIG. 2 shows a substrate (2) of a radiation-emitting organic electronic device (1) of the invention. The substrate (2) extends in an xy plane. In order to prevent plasmon excitation in a metallic electrode (not shown) in the radiation-emitting organic electronic device, the transition dipole moments of the $S_1$-$S_0$ transitions (8) of the molecules of the fluorescent compound are arranged in the xy plane, i.e., parallel to the plane of extension of the substrate (2). In order to fulfill this condition, the molecular plane (9) of the linear molecular chain of each individual molecule of the fluorescent compound may assume any desired orientation, provided that it contains the axis of the transition dipole moment (10). For example, a parallel arrangement (9-2) and a perpendicular arrangement (9-1) of the molecular plane of the linear molecular chain of the molecules of the fluorescent compound relative to the plane of extension of the substrate (2) are shown.

Figure 3:
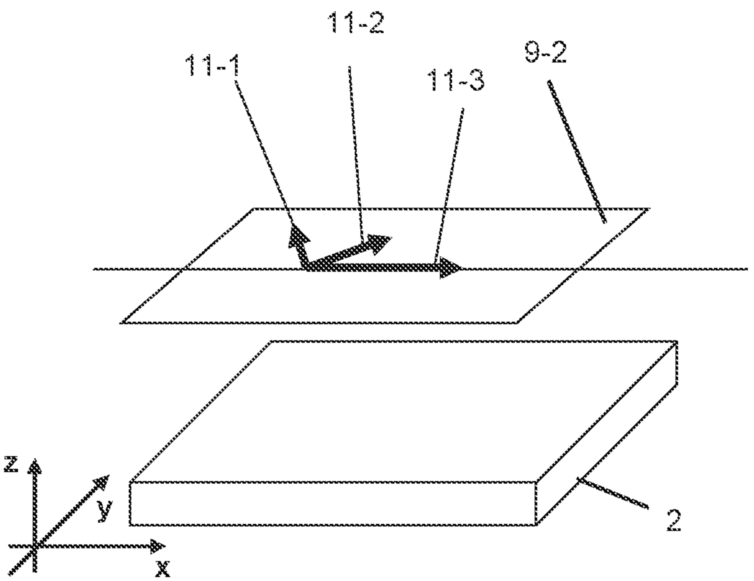
FIG. 3 shows the alignment of transition dipole moments of the molecules of a non-inventive phosphorescent emitter to the plane of extension of a substrate in a radiation-emitting organic electronic device.

FIG. 3 shows a substrate (2) of a radiation-emitting organic electronic device (1) of the prior art. The substrate (2) extends in an xy plane. The light-emitting layer contains non-inventive phosphorescent emitters (not shown). The transition dipole moments of the three different $T_1$-$S_0$ transitions of the phosphorescent emitters are indicated by 11-1, 11-2 and 11-3. In order to minimize plasmon excitation in a metallic electrode (not shown) in the radiation-emitting organic electronic device, the two transition dipole moments having the greatest dipole magnitude (indicated here by 11-3 and 11-2) of the molecules of the phosphorescent emitters have to be in the xy plane, i.e., parallel to the plane of extension of the substrate (2). In order to fulfill this condition, the molecular plane of the molecules of a known phosphorescent emitter cannot assume any desired orientation compared to the fluorescent compound of the invention. What is shown is a parallel arrangement of the molecular plane (9-2) with respect to the plane of extension of the substrate (2), in order to achieve a parallel arrangement of the transition dipole moments having the greatest dipole magnitude (11-3 and 11-2) with respect to the plane of extension of the substrate (2), in order thus to minimize the sum total of the projected components of the transition dipole moments (11-1, 11-2, 11-3) perpendicular to the plane of extension of the substrate (2) which are responsible for plasmon excitation. Compared to the fluorescent compounds of the invention, therefore, for conventional phosphorescent emitters, high demands on the alignment of the molecular plane have to be fulfilled in order to achieve at least minimization of the plasmon excitation. Complete or virtually complete suppression of plasmon excitation cannot be achieved by the use of phosphorescent emitters.

The invention is not restricted by the description with reference to the working examples. Instead, the invention encompasses every novel feature and every combination of features, which especially includes every combination of features in the claims, even if this feature or this combination itself is not specified explicitly in the claims or working examples.

The invention claimed is:

1. A method for producing a radiation-emitting organic electronic device, the method comprising:

providing a substrate;

applying a first electrode over the substrate;

applying a fluorescent compound over the first electrode, wherein the fluorescent compound forms at least a part of a light-emitting layer of the radiation-emitting organic electronic device; and applying a second electrode over the light-emitting layer, wherein the fluorescent compound consists of:

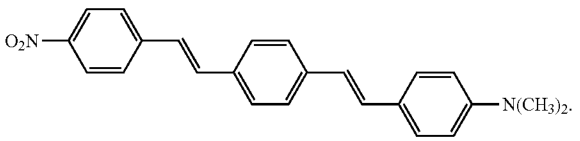 [SMILES: CN(C)c1ccc(/C=C/c2ccc(/C=C/c3ccc([N+](=O)[O-])cc3)cc2)cc1]

2. The method according to claim 1, wherein applying the fluorescent compound over the first electrode comprises evaporating the fluorescent compound under reduced pressure and depositing the fluorescent compound over the first electrode.

3. The method according to claim 2, wherein evaporating the fluorescent compound comprises co-evaporating the fluorescent compound and a matrix material.

4. The method according to claim 1, wherein applying the fluorescent compound over the first electrode comprises applying the fluorescent compound in a solution over the first electrode.

5. The method according to claim 1, further comprising applying a further light-emitting layer over the light-emitting layer before applying the second electrode.

6. The method according to claim 1, wherein the first electrode comprises a metal selected from the group consisting of aluminum, barium, indium, silver, gold, magnesium, calcium, samarium, germanium, zinc, copper, indium, tin and lithium.

7. The method according to claim 6, wherein the second electrode comprises a metal selected from the group consisting of aluminum, barium, indium, silver, gold, magnesium, calcium, germanium, samarium, zinc, copper, indium, tin and lithium.

8. The method according to claim 1, wherein the first electrode comprises magnesium and silver, and wherein the first electrode is transparent for light.

9. The method according to claim 8, wherein the second electrode comprises silver, and wherein the second electrode is reflective for light.

10. The method according to claim 1, wherein the second electrode comprises a metal selected from the group consisting of aluminum, barium, indium, silver, gold, magnesium, calcium, germanium, samarium, zinc, copper, indium, tin and lithium.

11. The method according to claim 1, wherein the second electrode comprises silver, and wherein the second electrode is reflective for light.

12. The method according to claim 1, wherein a distance of the light-emitting layer from the first electrode is between 1 nm and 90 nm.

13. The method according to claim 12, wherein a distance of the light-emitting layer from the second electrode is between 1 nm and 90 nm.

14. The method according to claim 1, wherein a distance of the light-emitting layer from the second electrode is between 1 nm and 90 nm.

* * * * *